(12) United States Patent
Takahashi et al.

(10) Patent No.: US 10,396,148 B2
(45) Date of Patent: Aug. 27, 2019

(54) SEMICONDUCTOR DEVICE

(71) Applicant: Murata Manufacturing Co., Ltd., Kyoto (JP)

(72) Inventors: Shinnosuke Takahashi, Kyoto (JP); Masayuki Aoike, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/960,845

(22) Filed: Apr. 24, 2018

(65) Prior Publication Data

US 2018/0308926 A1   Oct. 25, 2018

(30) Foreign Application Priority Data

Apr. 25, 2017  (JP) ................................. 2017-085762

(51) Int. Cl.
  *H01L 29/78*  (2006.01)
  *H01L 29/06*  (2006.01)
  (Continued)

(52) U.S. Cl.
  CPC .......... *H01L 29/0619* (2013.01); *H01L 21/76* (2013.01); *H01L 21/76224* (2013.01); *H01L 29/0626* (2013.01); *H01L 29/1075* (2013.01); *H01L 29/1083* (2013.01); *H01L 29/405* (2013.01); *H01L 29/42312* (2013.01); *H01L 29/66431* (2013.01); *H01L 29/66462* (2013.01); *H01L 29/7781* (2013.01); *H01L 29/7782* (2013.01); *H01L 29/7783* (2013.01); *H01L 29/7786* (2013.01); *H01L 29/205* (2013.01);
  (Continued)

(58) Field of Classification Search
  None
  See application file for complete search history.

(56) References Cited

U.S. PATENT DOCUMENTS

| 7,579,634 B2 | 8/2009 | Onodera et al. |
| 2006/0157734 A1 | 7/2006 | Onodera et al. |

(Continued)

FOREIGN PATENT DOCUMENTS

| CN | 1819265 A | 8/2006 |
| CN | 106206700 A | 12/2016 |

OTHER PUBLICATIONS

Peter George, et al. "The Reduction of Backgating in GaAs MESFET's by Impact Ionization", IEEE Electron Device Letters, Oct. 1990, vol. 11, No. 10, pp. 434-436, IEEE, Berkeley, California.

(Continued)

*Primary Examiner* — Minh Loan Tran
(74) *Attorney, Agent, or Firm* — Pearne & Gordon LLP

(57) ABSTRACT

A semiconductor layer arranged on a semiconductor substrate includes an active region and an element isolation region that surrounds the first active region when viewed in plan. A field effect transistor is formed in the active region. A plurality of guard ring electrodes separated from each other affect a potential of the active region through the element isolation region. An interlayer insulating film is formed over the semiconductor layer, the field effect transistor, and the guard ring electrodes. At least one guard ring connection wiring formed on the interlayer insulating film electrically interconnects the plurality of guard ring electrodes.

12 Claims, 12 Drawing Sheets

(51) Int. Cl.
*H01L 29/10* (2006.01)
*H01L 29/423* (2006.01)
*H01L 29/40* (2006.01)
*H01L 29/778* (2006.01)
*H01L 29/66* (2006.01)
*H01L 21/76* (2006.01)
*H01L 21/762* (2006.01)
*H01L 29/47* (2006.01)
*H01L 29/205* (2006.01)

(52) U.S. Cl.
CPC ...... *H01L 29/42316* (2013.01); *H01L 29/475* (2013.01); *H01L 29/778* (2013.01)

(56) References Cited

U.S. PATENT DOCUMENTS

| | | | |
|---|---|---|---|
| 2012/0299056 A1* | 11/2012 | Arai | H01L 29/404 |
| | | | 257/144 |
| 2014/0197476 A1* | 7/2014 | Shimatou | H01L 29/0619 |
| | | | 257/329 |
| 2016/0351657 A1* | 12/2016 | Senoo | H01L 29/404 |

OTHER PUBLICATIONS

L.G. Salmon, "A Comparative Study of GaAs Mesfet Backgating", 1991, GaAs IC Symposium, pp. 289-292, IEEE, Brigham Young University, Provo, Utah.

* cited by examiner

PRIOR ART

PRIOR ART

SEMICONDUCTOR DEVICE

This application claims priority from Japanese Patent Application No. 2017-085762 filed on Apr. 25, 2017. The content of this application is incorporated herein by reference in its entirety.

BACKGROUND

The present disclosure relates to a semiconductor device including a field effect transistor that is formed on a semiconductor substrate. U.S. Pat. No. 7,579,634 discloses a semiconductor device including a field effect transistor that serves as a low-distortion and low-loss radio frequency switch. The semiconductor device disclosed in U.S. Pat. No. 7,579,634 includes a substrate, an element formation region, an element isolation region, and a substrate voltage application electrode. The field effect transistor is formed in the element formation region, and the field effect transistor includes a hetero-junction, a gate electrode, a source electrode, and a drain electrode. The substrate voltage application electrode is formed at a surface of the element isolation region, and it continuously surrounds a plurality of sides of the field effect transistor. By applying a positive voltage to the substrate voltage application electrode, a capacitance in an off-state can be reduced.

"The Reduction of Backgating in GaAs MESFET's by Impact Ionization", IEEE ELECTRON DEVICE LETTERS, Vol. 11, No. 10, October 1990, discloses that, in a MESFET on a GaAs substrate, a drain current is reduced when a negative bias is applied to the substrate. Furthermore, the above paper explains that recovery of the drain current with an increase of a drain voltage is caused because holes generated by impact ionization compensate for negative space charges at a channel-substrate interface.

"A COMPARATIVE STUDY OF GaAs MESFET BACKGATING", Brigham Young University Provo, Utah 84602, GaAs IC symposium, discloses the result of applying a negative voltage to each of FET's formed on different substrates from an electrode that is formed on an active region lateral to the FET, and studying differences in reduction amounts of a drain current. The above paper states that the drain current is reduced when a backgate voltage is lowered (namely, an absolute value of the negative voltage is increased).

The semiconductor substrate including the FET formed thereon is usually held at a ground potential. When the positive voltage is applied to the substrate voltage application electrode in a state in which the semiconductor substrate of the semiconductor device disclosed in U.S. Pat. No. 7,579,634 is held at the ground potential, a leak current generates between the substrate voltage application electrode and the semiconductor substrate.

BRIEF SUMMARY

The present disclosure provides a semiconductor device capable of reducing the leak current.

According to a first embodiment of the present disclosure, a semiconductor device includes a semiconductor layer arranged on a semiconductor substrate and including a first active region and an element isolation region that surrounds the first active region when viewed in plan (viewed in a direction perpendicular to a surface of semiconductor layer that faces the first active region), a first field effect transistor formed in the first active region, a plurality of guard ring electrodes separated from each other and affecting a potential of the first active region through the element isolation region, an interlayer insulating film formed over the semiconductor layer, the first field effect transistor, and the guard ring electrodes, and at least one guard ring connection wiring formed on the interlayer insulating film and electrically interconnecting the plurality of guard ring electrodes.

Since the guard ring electrodes are in the form separated into a plurality of spaced electrodes, a contact area between the guard ring electrodes and the semiconductor layer is reduced in comparison with that in a configuration in which the guard ring electrodes are arranged continuously without necessarily any discontinuous points between them. As a result, a leak current can be reduced which may generate between the guard ring electrodes and the semiconductor substrate.

In a semiconductor device according to a second embodiment of the present disclosure, in addition to the features of the semiconductor device according to the first embodiment, the guard ring electrodes are arranged on the element isolation region.

A voltage applied to the guard ring electrodes on the element isolation region affects the potential of the first active region through the element isolation region.

In a semiconductor device according to a third embodiment of the present disclosure, in addition to the features of the semiconductor device according to the first embodiment, the guard ring electrodes are arranged on second active regions that are adjacent to the first active region with the element isolation region interposed therebetween when viewed in plan.

A voltage applied to the guard ring electrodes on the second active regions affects the potential of the first active region through both the second active regions and the element isolation region.

In a semiconductor device according to a fourth embodiment of the present disclosure, in addition to the features of the semiconductor device according to any one of the first to third embodiments, the first field effect transistor includes a source electrode, a drain electrode, and a gate electrode, a voltage being positive relative to a substrate potential of the semiconductor substrate is applied to the source electrode of the first field effect transistor, and the semiconductor device further includes a guard ring voltage application structure to apply, to the guard ring electrodes, a voltage being positive relative to the substrate potential.

By applying, to the guard ring electrodes, a voltage being positive relative to the substrate potential, the potential of the semiconductor layer within the first active region can be raised to the positive side. As a result, reduction of a drain current attributable to the so-called substrate bias effect can be suppressed.

In a semiconductor device according to a fifth embodiment of the present disclosure, in addition to the features of the semiconductor device according to the fourth embodiment, the guard ring voltage application structure connects the guard ring electrodes to the gate electrode.

In the case of a field effect transistor in which a voltage higher than that applied to the source electrode is applied to the gate electrode, a voltage higher than that applied to the source electrode can be applied to the guard ring electrodes by connecting the guard ring electrodes to the gate electrode. Accordingly, the effect of suppressing the reduction of the drain current attributable to the substrate bias effect can be enhanced. Such a connection configuration is particularly effective, for example, in a field effect transistor of the enhancement type that is used under a condition of a gate voltage being higher than a source voltage.

In a semiconductor device according to a sixth embodiment of the present disclosure, in addition to the features of the semiconductor device according to the fourth embodiment, the guard ring voltage application structure connects the guard ring electrodes to the source electrode or the drain electrode of the first field effect transistor.

In the case of a field effect transistor in which a voltage higher than that applied to the gate electrode is applied to the source electrode or the drain electrode, a voltage higher than that applied to the gate electrode can be applied to the guard ring electrodes by connecting the guard ring electrodes to the source electrode or the drain electrode. Accordingly, the effect of suppressing the reduction of the drain current attributable to the substrate bias effect can be enhanced. A field effect transistor of the depression type, for example, is very often used under a condition of the gate voltage being lower than the source voltage. Thus, the above-described configuration is particularly effective in the field effect transistor of the depression type that is used under the condition of the gate voltage being lower than the source voltage.

In a semiconductor device according to a seventh embodiment of the present disclosure, in addition to the features of the semiconductor device according to the fifth or sixth embodiment, the guard ring voltage application structure includes a portion that is made of a conductive material having higher resistance than the guard ring connection wiring.

Since a resistance value of the guard ring voltage application structure is increased, the leak current generating between the guard ring electrodes and the semiconductor substrate can be reduced.

In a semiconductor device according to an eighth embodiment of the present disclosure, in addition to the features of the semiconductor device according to any one of the fourth to sixth embodiments, the semiconductor layer includes a third active region that is arranged adjacent to the first active region with the element isolation region interposed therebetween, a second field effect transistor is formed in the third active region, the second field effect transistor including a source electrode to which a potential equal to the substrate potential is applied, and the guard ring electrodes include a portion arranged on the element isolation region between the first active region and the third active region, the portion being positioned closer to the first active region.

Since the guard ring electrodes include the portion positioned closer to the first active region than to the third active region, the guard ring electrodes can give a greater influence on the potential of the semiconductor layer within the first active region than on that of the semiconductor layer within the third active region. It is hence possible to reduce the substrate bias effect in the first field effect transistor, and to suppress the reduction of the drain current therein. Since the potential equal to the substrate potential is applied to the source electrode of the second field effect transistor formed within the third active region, the reduction of the drain current attributable to the substrate bias effect does not occur in the second field effect transistor.

In a semiconductor device according to a ninth embodiment of the present disclosure, in addition to the features of the semiconductor device according to any one of the first to eighth embodiments, the guard ring electrodes surround the first active region from at least two orthogonal directions.

Since the guard ring electrodes surround the first active region from at least two orthogonal directions, the voltage applied to the guard ring electrodes can more effectively affect the potential of the semiconductor layer within the first active region.

Other features, elements, characteristics and advantages of the present disclosure will become more apparent from the following detailed description of embodiments of the present disclosure with reference to the attached drawings.

DETAILED DESCRIPTION

Prior to explaining embodiments of the present disclosure, semiconductor devices according to reference examples will be described with reference to FIGS. 14A, 14B, 15A, 15B and 15C.

Figure 14A:
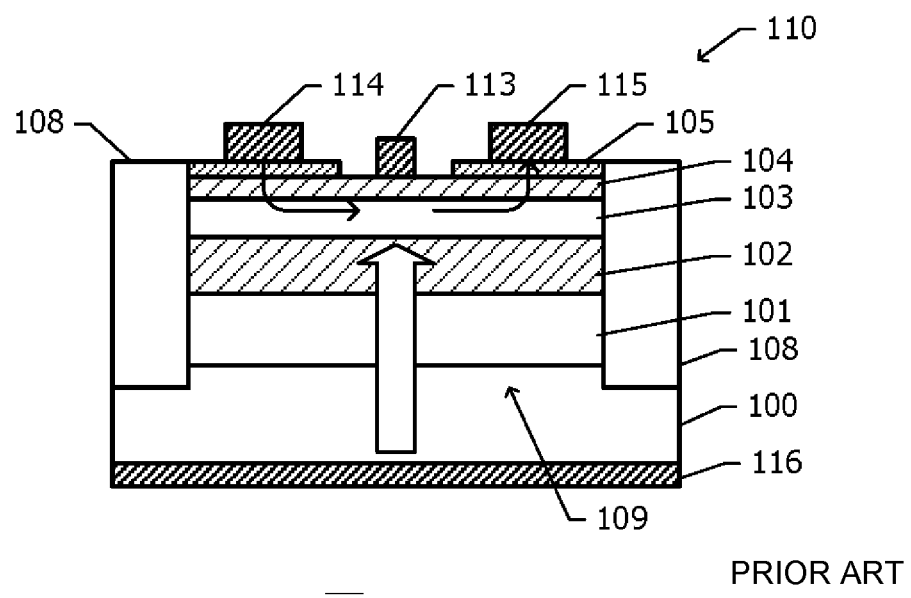
FIG. 14A is a schematic sectional view of a semiconductor device according to a first reference example.

FIG. 14A is a schematic sectional view of the semiconductor device according to the first reference example. A buffer layer 101, an electron supply layer 102, a channel layer 103, a Schottky gate formation layer 104, and a contact layer 105 are successively formed on a substrate 100 made of semi-insulating GaAs. An element isolation region 108 is formed in those semiconductor layers.

A high-electron-mobility transistor (HEMT) 110 is formed in an active region 109 surrounded by the element isolation region 108. The HEMT 110 includes a gate electrode 113, a source electrode 114, and a drain electrode 115. A substrate electrode 116 is formed at a rear surface of the substrate 100.

Figure 14B:
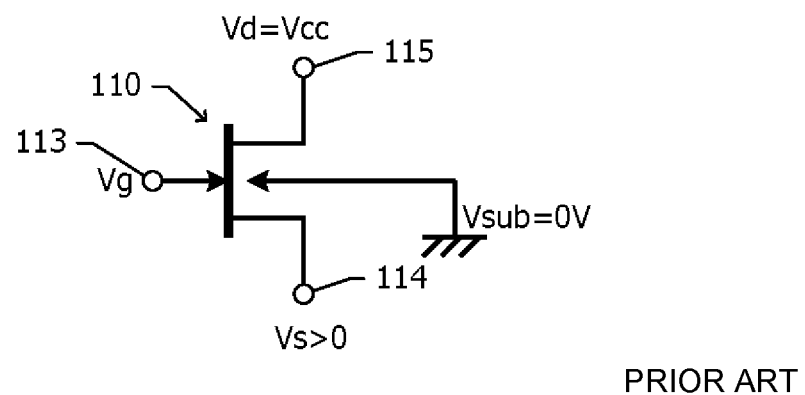
FIG. 14B is an illustration representing an example of conditions of biases applied to individual electrodes when a source follower circuit is constituted using an enhancement type HEMT.

FIG. 14B is an illustration representing an example of conditions of biases applied to the individual electrodes when a source follower circuit is constituted using the enhancement type HEMT 110 (FIG. 14A). The substrate electrode 116 is grounded, and a substrate potential Vsub is set to 0 V. A drain voltage Vd applied to the drain electrode 115 is equal to a power supply voltage Vcc. When the HEMT 110 is used in a bias circuit, a state in which a source voltage Vs applied to the source electrode 114 becomes positive relative to the substrate potential Vsub may occur in some cases. A gate voltage Vg applied to the gate electrode 113 is not lower than the source voltage Vs and not higher than the drain voltage Vd.

When the source voltage Vs becomes positive relative to the substrate potential Vsub, this is substantially equivalent to a state in which a negative potential is applied to the substrate side with respect to the source electrode 114. At that time, a channel is modulated by the negative potential of the substrate, and a threshold voltage is increased. As a result, the drain current Id is reduced (see, for example, both the above-cited papers). Such a phenomenon is called a substrate bias effect or a backgating effect.

Figure 15A:
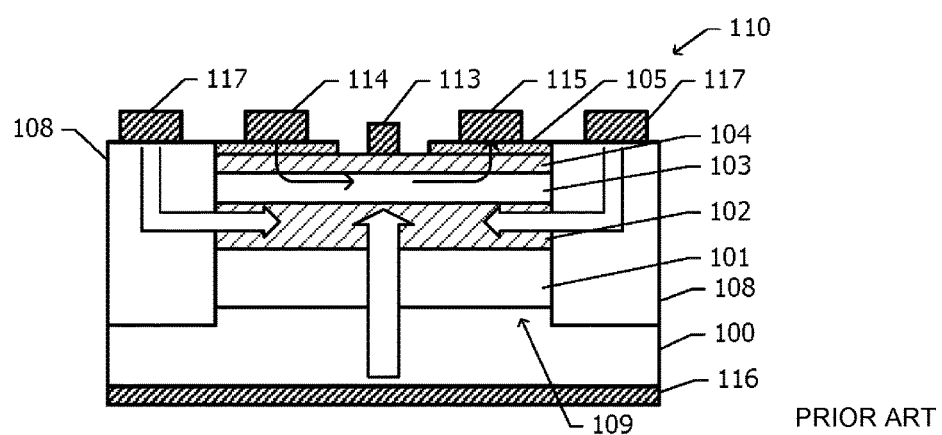
FIG. 15A is a schematic sectional view of a semiconductor device according to a second reference example.

FIG. 15A is a schematic sectional view of a semiconductor device according to a second reference example. In this example, a guard ring electrode 117 is disposed on the element isolation regions 108 in addition to the configuration of the semiconductor device according to the first reference example illustrated in FIG. 14A. The guard ring electrode 117 continuously surrounds the active region 109 when viewed in plan. By setting a guard ring voltage Vgr applied to the guard ring electrode to be positive relative to the substrate potential Vsub, potentials of the individual semiconductor layers within the active region 109 can be raised to the positive side. In other words, although a conduction band near the channel is lifted up due to the substantially negative potential applied to the rear surface of the substrate and a sheet carrier concentration is reduced, it is possible to suppress the lift-up of the conduction band and hence to suppress the reduction of the sheet carrier concentration by applying the guard ring voltage Vgr. As a result, an influence of the substantially negative potential on the substrate side (i.e., the substrate bias effect) can be reduced.

Evaluation experiments were conducted to confirm the effect resulting from applying the positive guard ring voltage Vgr to the guard ring electrode 117. Results of the evaluation experiments will be described below with reference to FIGS. 15B and 15C.

Figure 15B:
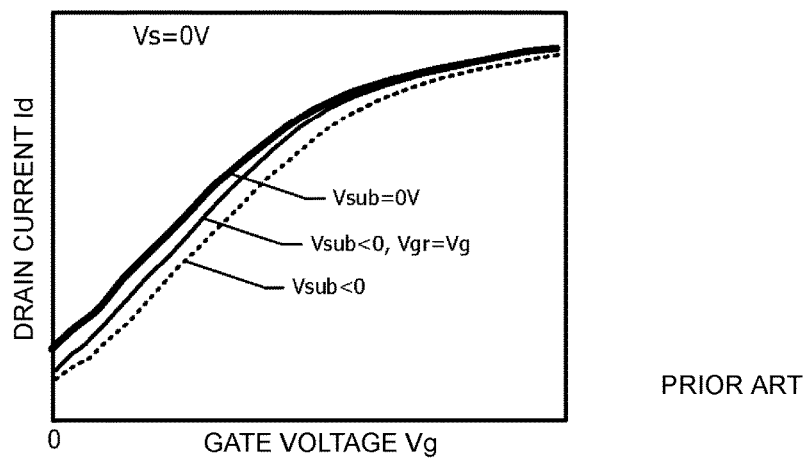
FIG. 15B is a graph representing relations between a gate voltage Vg and a drain current Id.

FIG. 15B is a graph representing relations between the gate voltage Vg and the drain current Id. A horizontal axis denotes the gate voltage Vg in arbitrary unit, and a vertical axis denotes the drain current Id in a logarithmic scale. The evaluation experiments were conducted on condition of the source voltage Vs being set to 0 V. In the graph of FIG. 15B, a thick solid line represents the measurement result in the case of the substrate potential Vsub=0 V, namely when the potential of the source electrode 114 and the substrate potential Vsub are equal to each other. A dotted line represents the measurement result when the substrate potential Vsub is set to a negative voltage and the guard ring electrode 117 is held in a floating state. A thin solid line represents the measurement result when the substrate potential Vsub is set to the same negative voltage as that in the above case represented by the dotted line and the guard ring voltage Vgr is set equal to the gate voltage Vg.

Figure 15C:
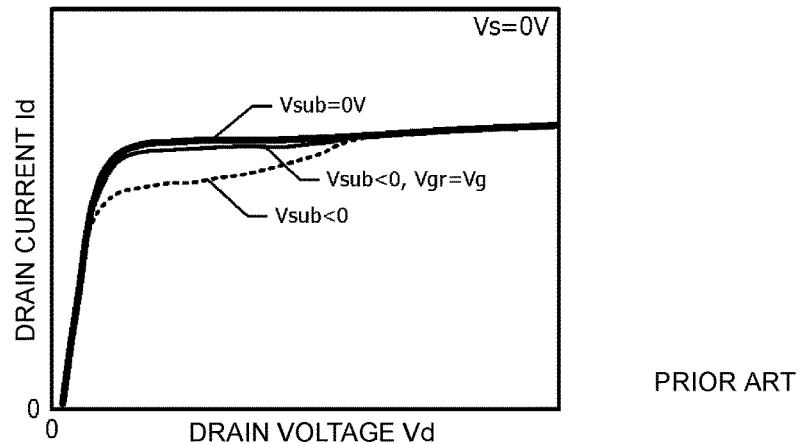
FIG. 15C is a graph representing relations between a drain voltage Vd and the drain current Id when the gate voltage Vg is kept fixed.

FIG. 15C is a graph representing relations between the drain voltage Vd and the drain current Id when the gate voltage Vg is kept fixed. A horizontal axis denotes the drain voltage Vd in arbitrary unit, and a vertical axis denotes the drain current Id in arbitrary unit. The evaluation experiments were conducted on condition of the source voltage Vs being set to 0 V. In the graph of FIG. 15C, a thick solid line represents the measurement result in the case of the substrate potential Vsub=0 V, namely when the potential of the source electrode 114 and the substrate potential Vsub are equal to each other. A dotted line represents the measurement result when the substrate potential Vsub is set to a negative voltage and the guard ring electrode 117 is held in the floating state. A thin solid line represents the measurement result when the substrate potential Vsub is set to the same negative voltage as that in the above case represented by the dotted line and the guard ring voltage Vgr is set equal to the gate voltage Vg.

As seen from the experiment results illustrated in FIGS. 15B and 15C, when the substrate potential Vsub is negative, the drain current Id is reduced due to the substrate bias effect (i.e., the backgating effect). It is also seen that, under the condition where the substrate potential Vsub is negative and a positive voltage equal to the gate voltage Vg is applied to the guard ring electrode 117 (FIG. 15A), a reduction amount of the drain current Id is reduced, and the drain current Id is recovered. Thus, the reduction of the drain current Id can be suppressed by setting the guard ring voltage Vgr to be positive relative to the substrate potential Vsub.

The state in which the substrate potential Vsub is set to 0 V and the source voltage Vs is set to be positive is equivalent to the state in which the source voltage Vs is set to 0 V and the substrate potential Vsub is set to be negative. Thus, it was confirmed from the above evaluation results that the reduction of the drain current Id can be suppressed by applying the positive voltage to the guard ring electrode 117 under the condition where the substrate potential Vsub is set to 0 V and the source voltage Vs is set to be positive.

[First Embodiment]

A semiconductor device according to a first embodiment will be described below with reference to FIGS. 1A, 1B and 1C.

Figure 1A:
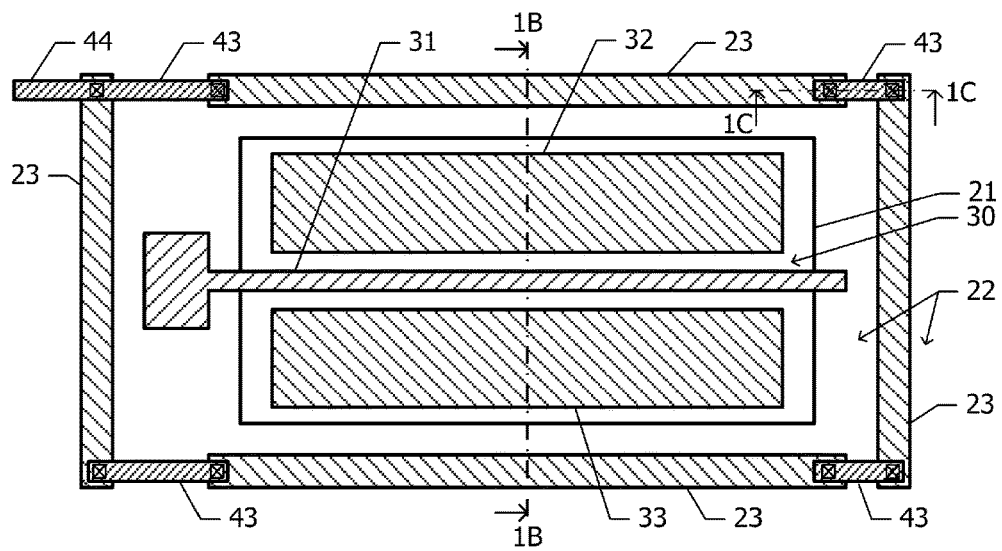
FIG. 1A is a plan view of a semiconductor device according to a first embodiment.
Figure 1B:
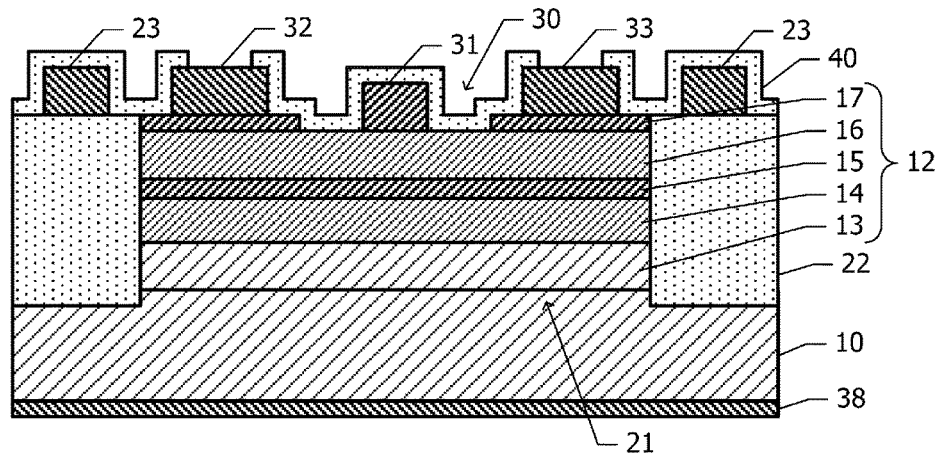
FIGS. 1B and 1C are sectional views taken along a one-dot-chain line 1B-1B and a one-dot-chain line 1C-1C in FIG. 1A, respectively.
Figure 1C:
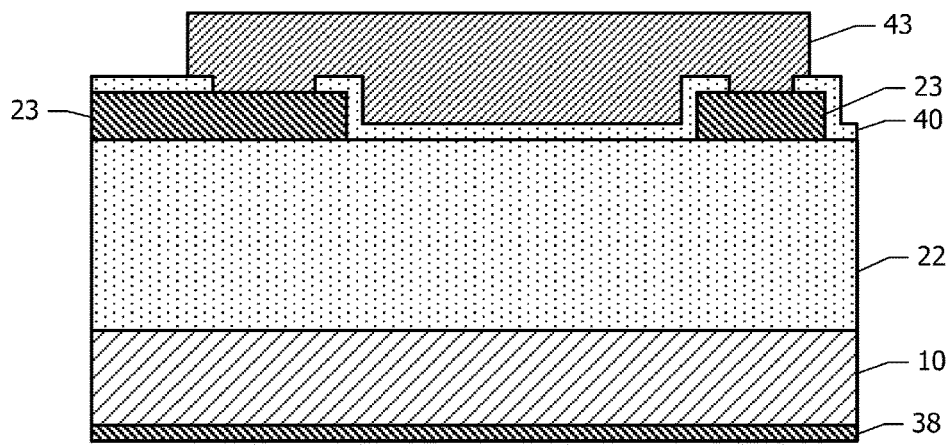

FIG. 1A is a plan view of the semiconductor device according to the first embodiment. FIGS. 1B and 1C are sectional views taken along a one-dot-chain line 1B-1B and a one-dot-chain line 1C-1C in FIG. 1A, respectively. A semiconductor layer 12 is formed on a semiconductor substrate 10 made of semi-insulating GaAs. The semiconductor layer 12 includes a buffer layer 13, an electron supply layer 14, a channel layer 15, a Schottky gate formation layer 16, and a contact layer 17, which are successively laminated from the lower side. The buffer layer 13 is made of non-doped AlGaAs, for example. The electron supply layer 14 and the Schottky gate formation layer 16 are made of n-type AlGaAs, for example. The channel layer 15 is made of non-doped InGaAs, for example. The contact layer 17 is made of n-type GaAs, for example.

An element isolation region 22 is formed in part of a region of the semiconductor layer 12 when viewed in plan. The element isolation region 22 is formed, for example, by ion-implanting boron (B). The element isolation region 22 surrounds an active region 21. The active region 21 has a substantially rectangular or square shape in plan. A field effect transistor 30 is formed in the active region 21.

The field effect transistor 30 includes a gate electrode 31, a source electrode 32, a drain electrode 33, and the semiconductor layer 12 within the active region 21. The gate electrode 31 is arranged in a region where the contact layer 17 is removed and the Schottky gate formation layer 16 is exposed. The gate electrode 31 is in Schottky contact with the Schottky gate formation layer 16. The source electrode 32 and the drain electrode 33 arranged on both sides of the gate electrode 31 in a sandwiching relation when viewed in plan are ohmic-connected to the channel layer 15 through the contact layer 17 and the Schottky gate formation layer 16. Thus, in the first embodiment, a high-electron-mobility transistor (HEMT) is used as the field effect transistor 30. The gate electrode 31 extends from the active region 21 to a position above the element isolation region 22, and a portion of the gate electrode 31 positioned above the element isolation region 22 is connected to an upper-layer wiring. The gate electrode 31 has a two-layer structure of a Ni layer and an Au layer, for example. The source electrode 32 and the drain electrode 33 are each made of an AuGe alloy, for example.

A plurality of guard ring electrodes 23 separated from each other are formed on the element isolation region 22. In an example illustrated in FIG. 1A, the guard ring electrodes 23 in number four are formed and arranged along a path circumscribing the active region 21 so as to surround the active region 21 from four directions when viewed in plan. The four guard ring electrodes 23 are arranged, for example, parallel respectively to four sides of the active regions 21 when viewed in plan. The guard ring electrodes 23 are made of an AuGe alloy, for example.

An interlayer insulating film 40 is formed over the field effect transistor 30, the guard ring electrodes 23, and the semiconductor layer 12. The interlayer insulating film 40 is made of SiN, for example. A plurality of guard ring connection wirings 43 are formed on the interlayer insulating film 40. The guard ring connection wirings 43 electrically interconnect the guard ring electrodes 23 through contact holes that are formed in the interlayer insulating film 40.

The guard ring connection wirings 43 extend from both ends of each of two (i.e., the guard ring electrodes 23 extending horizontally in FIG. 1A) among the plurality of guard ring electrodes 23 along extension lines of the relevant guard ring electrode 23. The extension lines intersect the other two guard ring electrodes 23 (i.e., the guard ring electrodes 23 extending vertically in FIG. 1A), and the guard ring connection wirings 43 are connected to the other guard ring electrodes 23 at intersection points.

The semiconductor device according to the first embodiment includes a guard ring voltage application structure for applying the guard ring voltage Vgr to the guard ring electrodes 23. A guard ring voltage application wiring 44 extends from at least one of the guard ring connection wirings 43, for example, the guard ring connection wiring 43 at an upper left position in FIG. 1A, to the left. The guard ring voltage Vgr is applied to the guard ring electrodes 23 through the guard ring voltage application wiring 44. The guard ring voltage application wiring 44 functions as the guard ring voltage application structure.

The guard ring electrodes 23 affect a potential of the active region 21 through the element isolation region 22. Though not illustrated in FIG. 1A, wirings formed on the interlayer insulating film 40 are also connected to the gate electrode 31, the source electrode 32, and the drain electrode 33. Each of the guard ring connection wirings 43 and the other wirings formed on the interlayer insulating film 40 includes, for example, two layers made up of a lower Ti layer and an upper Au layer.

A substrate electrode 38 is formed at a rear surface of the semiconductor substrate 10. The substrate electrode 38 may be of, for example, a two-layer structure including a Ti layer and an Au layer. The substrate electrode 38 serves to apply the substrate potential Vsub to the semiconductor substrate 10.

The semiconductor device according to the first embodiment can be fabricated by using a well-known semiconductor process. For example, metal organic chemical vapor deposition (MOCVD) can be used to form each layer in the semiconductor layer 12. A lift-off method can be used to form the gate electrode 31, the source electrode 32, the drain electrode 33, the guard ring electrodes 23, the guard ring connection wirings 43, etc. A CVD method can be used to form the interlayer insulating film 40.

[Advantageous Effects of First Embodiment]

Advantageous effects of the first embodiment will be described below.

The guard ring voltage Vgr can be applied to the guard ring electrodes 23 through the guard ring voltage application wiring 44. The following study is made on the state in which the substrate potential Vsub is set to the ground potential and the source voltage Vs applied to the source electrode 32 is set to be positive (i.e., the state in which the substrate bias effect is developed) as illustrated in FIG. 14B. In the first embodiment, the potential of the semiconductor layer 12 within the active region 21 can be raised to the positive side by setting the guard ring voltage Vgr to be positive. As a result, the reduction of the drain current Id attributable to the substrate bias effect can be suppressed as discussed above with reference to FIGS. 15A, 15B and 15C.

Furthermore, in the first embodiment, the guard ring voltage Vgr can be applied to all of the guard ring electrodes 23 because the guard ring electrodes 23 are interconnected by the guard ring connection wirings 43. Moreover, a contact area between the guard ring electrodes 23 and the element isolation region 22 can be reduced because the guard ring electrodes 23 are in the form separated into a plurality of spaced electrodes instead of continuously surrounding the active region 21 without necessarily any discontinuous points between them. With the above arrangement, a leak current can be reduced which may generate between the guard ring electrodes 23 and the semiconductor substrate 10, between the guard ring electrodes 23 and the source electrode 32, and between the guard ring electrodes 23 and the drain electrode 33.

In the first embodiment, the four guard ring electrodes 23 surround the substantially rectangular or square active region 21 from the four directions, and they are arranged parallel to the four sides of the active region 21 in a one-to-one relation. The guard ring connection wirings 43 are arranged outside both ends of each of the four sides of the active region 21. Looking at one guard ring electrode 23 and the guard ring connection wirings 43 arranged on the extension lines of the relevant guard ring electrode 23, the relevant guard ring electrode 23 is arranged at a position closer to the active region 21 than those guard ring connection wirings 43.

The guard ring electrode 23 arranged at a position closer to the active region 21 can more effectively raise the potential in a channel-formed region just under the gate electrode 31 to the positive side than the guard ring electrode 23 arranged at a position farther away from the active region 21. Conversely, the guard ring electrode arranged at the position farther away from the active region 21 is less effective in raising the potential of the channel-formed region to the positive side. In the first embodiment, discontinuous points of the guard ring electrodes 23 (i.e., points where the guard ring connection wirings 43 are arranged) are present at the positions farther away from the active region 21. Therefore, the effect of raising the potential of the channel-formed region is hardly reduced even when the points at which the guard ring electrodes 23 are not arranged are positioned around the active region 21.

Supposing a configuration in which the guard ring electrodes 23 continuously surround the active region 21 without necessarily any discontinuous points between them, lift-off performance degrades when the guard ring electrodes 23 are formed by the lift-off method. Thus, such a configuration increases a possibility of, for example, generating burrs in the guard ring electrodes 23, or causing a problem of a resist being left in a region surrounded by the guard ring electrodes 23. In the first embodiment, since the guard ring electrodes 23 do not continuously surround the active region 21 without necessarily any discontinuous points between them, degradation of the lift-off performance can be avoided.

Various modifications of the first embodiment will be described below.

While, in the first embodiment, the guard ring electrodes 23 are made of the same material as the source electrode 32 and the drain electrode 33 adapted for ohmic contact, they may be made of the same material as the gate electrode 31. While, in the first embodiment, each of the guard ring electrodes 23 is formed to have a plan shape extending along one linear line, the guard ring electrode 23 may have another plan shape depending on a positional relation in layout with respect to other elements formed on the semiconductor substrate 10. For instance, the guard ring electrode 23 may have a plan shape extending along a perpendicularly bent line that includes a portion extending in a vertical direction and a portion extending in a horizontal direction when viewed in FIG. 1A. Alternatively, the guard ring electrode 23 may have a plan shape including an obliquely extending portion as well.

The configuration of the guard ring electrodes 23, described in the first embodiment, can be further applied to HEMT's other than the HEMT having the structure described in the first embodiment. For instance, an n-type AlGaAs layer may be arranged on only one of the lower side and the upper side of the channel layer 15. A material other than InGaAs, for example, GaAs may be used as the channel layer 15. While, in the first embodiment, the GaAs-based HEMT is used, by way of example, as the field effect transistor 30, the configuration of the guard ring electrodes 23, described in the first embodiment, can be further applied to HEMT's using other materials. Thus, the configuration of the guard ring electrodes 23 can be applied to, for example, an InP-based HEMT using an InP substrate, a GaN-based HEMT using a SiC substrate, and a SiGe-based HEMT using a Si substrate as well. It is to be noted that the semiconductor layer 12 formed on the semiconductor substrate 10 has a hetero-junction using a compound semiconductor.

While, in the first embodiment, the guard ring connection wirings 43 are formed directly on the interlayer insulating film 40 (see FIG. 1C), a resin film of polyimide, for example, may be formed on the interlayer insulating film 40, and the guard ring connection wiring 43 may be formed on the resin film.

[Second Embodiment]

A semiconductor device according to a second embodiment will be described below with reference to FIGS. 2A and 2B. In the following, description of configurations common to those in the semiconductor device according to the first embodiment (FIGS. 1A, 1B and 1C) is omitted.

Figure 2A:
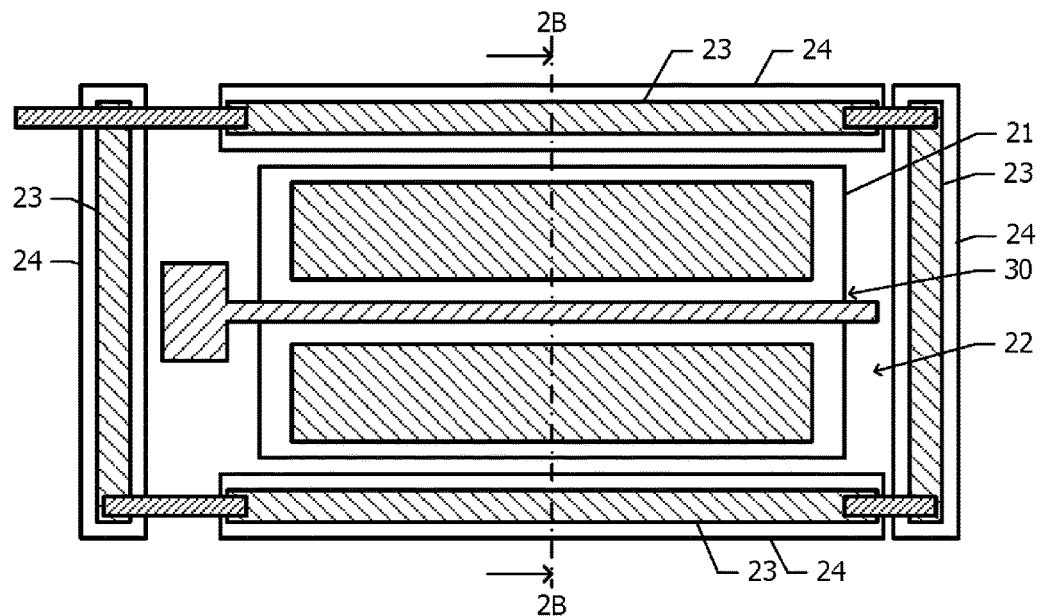
FIG. 2A is a plan view of a semiconductor device according to a second embodiment.
Figure 2B:
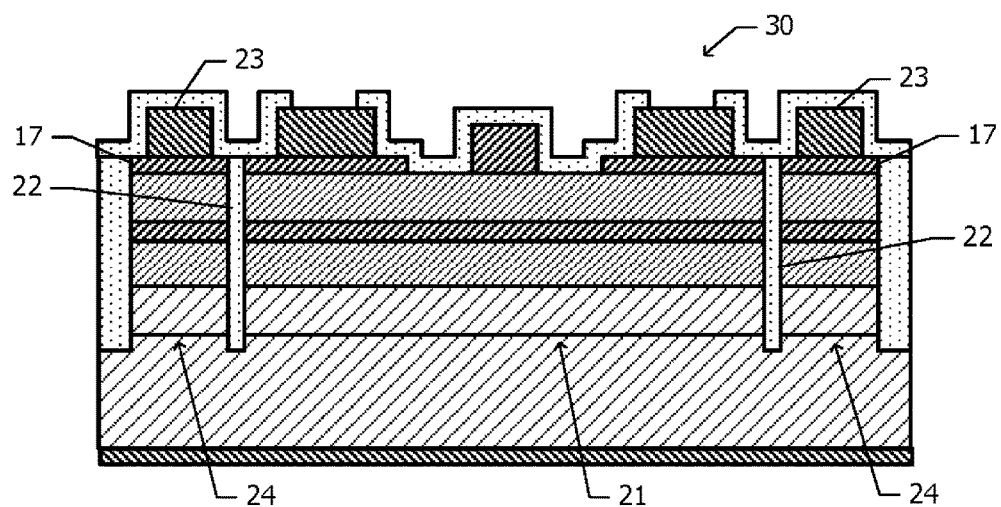
FIG. 2B is a sectional view taken along a one-dot-chain line 2B-2B in FIG. 2A.

FIG. 2A is a plan view of the semiconductor device according to the second embodiment, and FIG. 2B is a sectional view taken along a one-dot-chain line 2B-2B in FIG. 2A. In the first embodiment, the guard ring electrodes 23 are arranged on the element isolation region 22. In the second embodiment, the guard ring electrodes 23 are arranged on other active regions 24 adjacent to the active region 21 with the element isolation region 22 interposed therebetween. The guard ring electrodes 23 are held in ohmic contact or Schottky contact with the contact layers 17 within the active regions 24.

Also, in the second embodiment, the guard ring electrodes 23 to which the guard ring voltage Vgr is applied affect the potential of the active region 21 through the element isolation region 22. Moreover, in the second embodiment, the guard ring electrodes 23 in the form separated into a plurality of spaced electrodes surround the active region 21 instead of continuously surrounding the active region 21 without necessarily any discontinuous points between them. Accordingly, as in the first embodiment, an increase of the leak current can be suppressed, and degradation of the lift-off performance can be avoided.

[Third Embodiment]

A semiconductor device according to a third embodiment will be described below with reference to FIG. 3. In the following, description of configurations common to those in the semiconductor device according to the first embodiment (FIGS. 1A, 1B and 1C) is omitted. The HEMT is used as the field effect transistor 30 in the first embodiment, whereas an MESFET is used as the field effect transistor 30 in the third embodiment.

Figure 3:
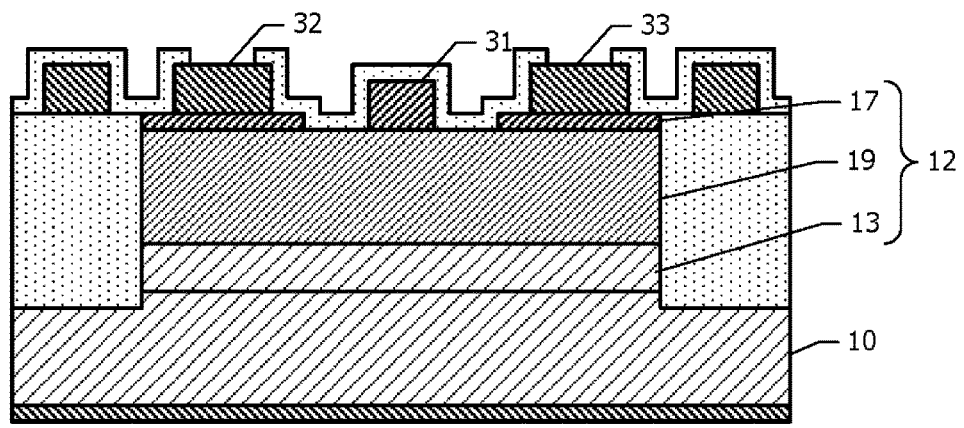
FIG. 3 is a sectional view of a semiconductor device according to a third embodiment.

FIG. 3 is a sectional view of the semiconductor device according to the third embodiment. A semiconductor layer 12 formed on the semiconductor substrate 10 includes a buffer layer 13, a channel layer 19, and a contact layer 17, which are successively laminated from the substrate side. The buffer layer 13, the channel layer 19, and the contact layer 17 are made of non-doped AlGaAs, n-type GaAs, and n-type GaAs, respectively. The gate electrode 31 is held in Schottky contact with the channel layer 19, and the source electrode 32 and the drain electrode 33 are ohmic-connected to the channel layer 19 through the contact layer 17.

Even when the MESFET is used as the field effect transistor 30, similar advantageous effects to those in the first embodiment using the HEMT are obtained. A compound semiconductor may be used as the channel layer 19 from the viewpoint of making an operation frequency higher.

[Fourth Embodiment]

A semiconductor device according to a fourth embodiment will be described below with reference to FIG. 4. In the following, description of configurations common to those in the semiconductor device (FIGS. 1A, 1B and 1C) according to the first embodiment is omitted.

Figure 4:
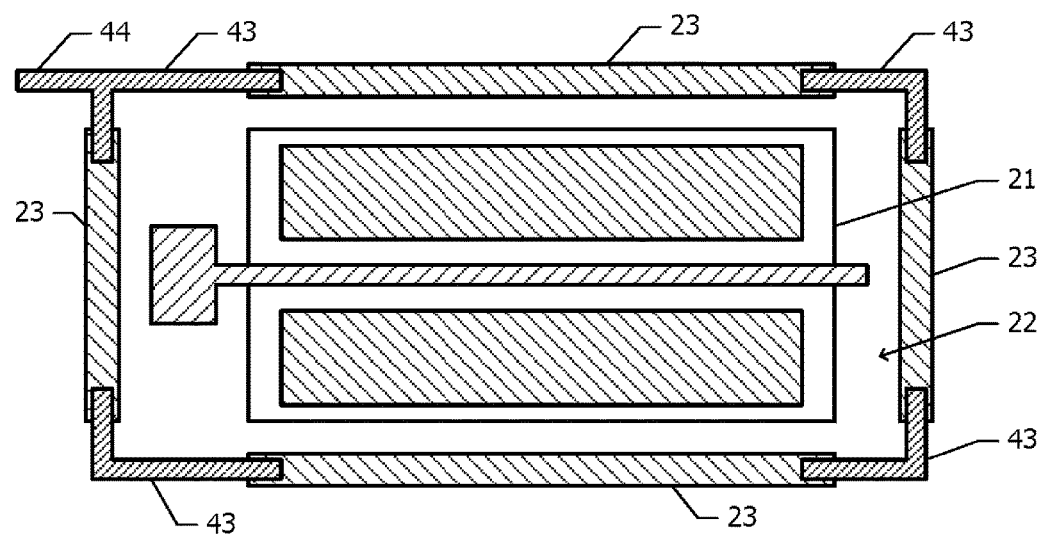
FIG. 4 is a plan view of a semiconductor device according to a fourth embodiment.

FIG. 4 is a plan view of the semiconductor device according to the fourth embodiment. In the first embodiment, the extension lines of the horizontally-extending guard ring electrodes 23 extending in a lengthwise direction intersect the vertically-extending guard ring electrodes 23. The guard ring connection wirings 43 are arranged to extend along the extension lines. On the other hand, in the fourth embodiment, the vertically-extending guard ring electrodes 23 (FIG. 4) are shorter than the vertically-extending guard ring electrodes 23 (FIG. 1A) in the first embodiment. Therefore, the extension lines of the horizontally-extending guard ring electrodes 23 extending in the lengthwise direction do not intersect the vertically-extending guard ring electrodes 23.

In the fourth embodiment, each of the guard ring connection wirings 43 has a substantially perpendicularly-bent L-like shape in plan. Each guard ring connection wiring 43 is constituted by a portion extending along the extension line of the horizontally-long guard ring electrode 23, and a portion extending along an extension line of the vertically-long guard ring electrodes 23. The guard ring voltage application wiring 44 is connected to at least one of the guard ring connection wirings 43.

The guard ring connection wiring 43 is arranged at the position farther away from the active region 21 than the guard ring electrode 23. Even when the positive potential is applied to the guard ring electrode arranged on the element isolation region 22 at the position farther away from the active region 21, the effect of raising the potential in the channel-formed region to the positive side is low. In the fourth embodiment, the contact area between the guard ring electrodes 23 and the element isolation region 22 is reduced by not arranging the guard ring electrodes 23 in zones where the effect of raising the potential in the channel-formed region to the positive side is low. As a result, the effect of reducing the leak current can be enhanced.

For instance, the guard ring electrodes 23 can be each arranged to be positioned in a zone between two extension lines of two opposing sides of the substantially rectangular or square active region 21 in a state of spanning from one of the two extension lines to the other. The guard ring connection wiring 43 can be arranged to interconnect two of the four guard ring electrodes 23 corresponding to the four sides of the active region 21, the two being adjacent to each other.

[Fifth Embodiment]

A semiconductor device according to a fifth embodiment will be described below with reference to FIG. 5. In the following, description of configurations common to those in the semiconductor device (FIGS. 1A, 1B and 1C) according to the first embodiment is omitted.

Figure 5:
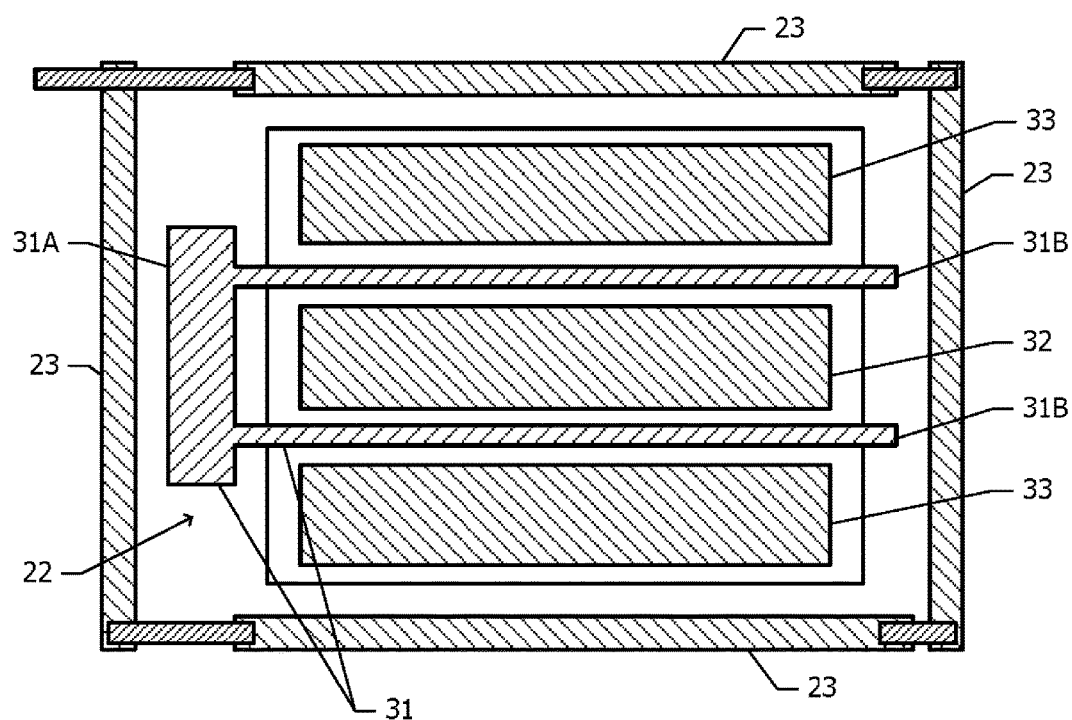
FIG. 5 is a plan view of a semiconductor device according to a fifth embodiment.

FIG. 5 is a plan view of the semiconductor device according to the fifth embodiment. In the fifth embodiment, the gate electrode 31 includes two gate fingers 31B and a gate connecting portion 31A that connects the gate fingers 31B to each other. The two gate fingers 31B are arranged on the active region 21, and channels are formed just under the two gate fingers 31B, respectively. The gate connecting portion 31A is arranged on the element isolation region 22. The active region 21 is divided into three zones by the two gate fingers 31B. The source electrode 32 is arranged in a central zone, and the drain electrode 33 is arranged in each of two zones at both ends.

Even when the gate electrode 31 has a comb-like shape including the plurality of gate fingers 31B as in the fifth embodiment, the potential of the channel-formed region can be raised to the positive side with the guard ring voltage Vrg applied to the guard ring electrodes 23. Accordingly, as in the first embodiment, the reduction of the drain current Id can be suppressed. Furthermore, since the points at which the guard ring electrodes 23 are not arranged are present in the path circumscribing the active region 21, the leak current can be reduced.

[Sixth Embodiment]

A semiconductor device according to a sixth embodiment will be described below with reference to FIG. 6. In the following, description of configurations common to those in the semiconductor device (FIGS. 1A, 1B and 1C) according to the first embodiment is omitted.

Figure 6:
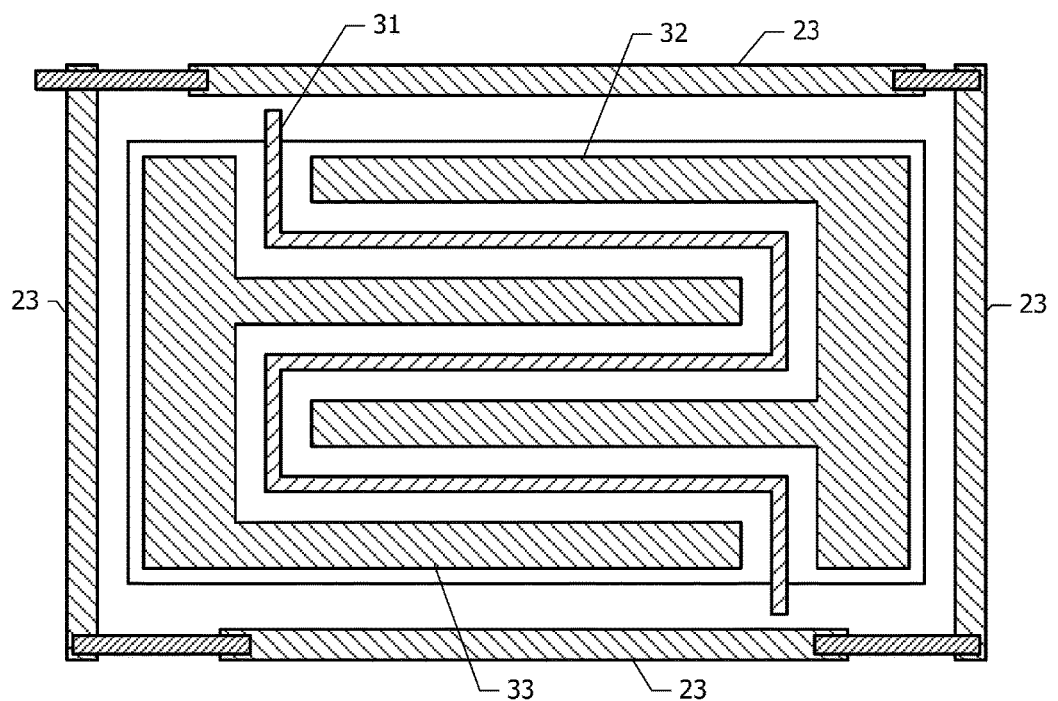
FIG. 6 is a plan view of a semiconductor device according to a sixth embodiment.

FIG. 6 is a plan view of the semiconductor device according to the sixth embodiment. In the sixth embodiment, the gate electrode 31 is bent in a meander shape. The active region 21 is divided into two zones by the meander-shaped gate electrode 31. The source electrode 32 is arranged in one of the two zones, and the drain electrode 33 is arranged in the other zone. A channel having a meander shape when viewed in plan is formed just under the meander gate electrode 31.

Even when the gate electrode 31 is bent in the meander shape as in the sixth embodiment, the potential of the channel-formed region can be raised to the positive side with the guard ring voltage Vrg applied to the guard ring electrodes 23. Accordingly, as in the first embodiment, the reduction of the drain current Id can be suppressed. Furthermore, since the points at which the guard ring electrodes 23 are not arranged are present in the path circumscribing the active region 21, the leak current can be reduced.

[Seventh Embodiment]

A semiconductor device according to a seventh embodiment will be described below with reference to FIG. 7. In the following, description of configurations common to those in the semiconductor device (FIGS. 1A, 1B and 1C) according to the first embodiment is omitted.

Figure 7:
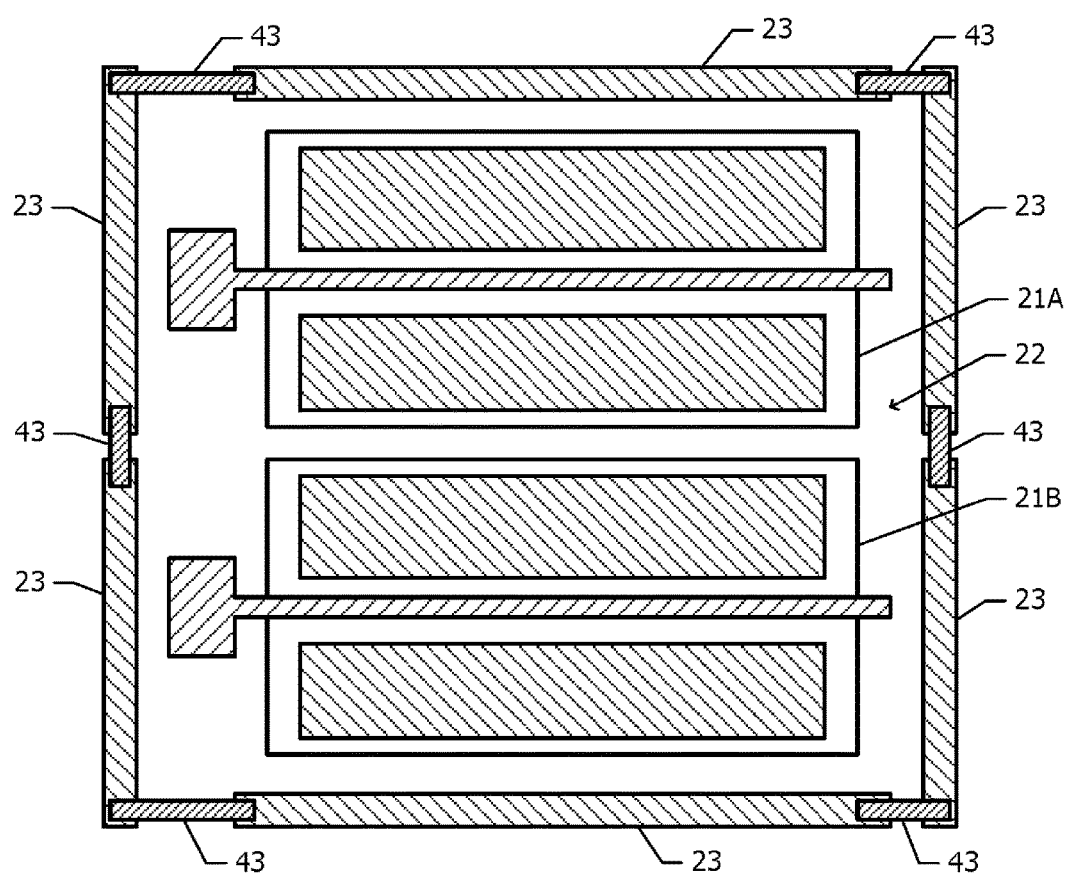
FIG. 7 is a plan view of a semiconductor device according to a seventh embodiment.

FIG. 7 is a plan view of the semiconductor device according to the seventh embodiment. Plural guard ring electrodes 23 surround two active regions 21A and 21B from four directions. Each of the two active regions 21A and 21B has a substantially rectangular or square shape in plan. The two active regions 21A and 21B are arranged side by side in the vertical direction in FIG. 7 with the element isolation region 22 interposed therebetween. No guard ring electrodes 23 are arranged on the element isolation region 22 between the two active regions 21A and 21B.

Looking at one active region 21A, three guard ring electrodes 23 surround the active region 21A from three directions (right, above, and left). Those three guard ring electrodes 23 are interconnected by the guard ring connection wirings 43. Looking at the other active region 21B, three guard ring electrodes 23 surround the active region 21B from three directions (right, below, and left). Those three guard ring electrodes 23 are also interconnected by the guard ring connection wirings 43.

The guard ring electrode 23 surrounding the one active region 21A from the right and the guard ring electrode 23 surrounding the other active region 21B from the same direction, i.e., from the right, are arranged to lie on one linear line, and they are connected to each other by the guard ring connection wiring 43. Similarly, the guard ring electrode 23 surrounding the one active region 21A from the left and the guard ring electrode 23 surrounding the other active region 21B from the same direction, i.e., from the left, are arranged to lie on one linear line, and they are connected to each other by the guard ring connection wiring 43.

Also, in the seventh embodiment, as in the first embodiment, the reduction of the drain current Id can be suppressed, and the leak current can be reduced.

A modification of the seventh embodiment will be described below. In the seventh embodiment, the guard ring electrode 23 surrounding the one active region 21A from the right and the guard ring electrode 23 surrounding the other active region 21B from the right are connected to each other by the guard ring connection wiring 43. As an alternative, the guard ring electrode 23 surrounding the one active region 21A from the right and the guard ring electrode 23 surrounding the other active region 21B from the right may be continuously joined into one linear pattern. Similarly, the guard ring electrode 23 surrounding the one active region 21A from the left and the guard ring electrode 23 surrounding the other active region 21B from the left may be continuously joined into one linear pattern.

[Eighth Embodiment]

Semiconductor devices according to an eighth embodiment will be described below with reference to FIGS. 8A and 8B. In the following, description of configurations common to those in the semiconductor device (FIGS. 1A, 1B and 1C) according to the first embodiment is omitted.

Figure 8A:
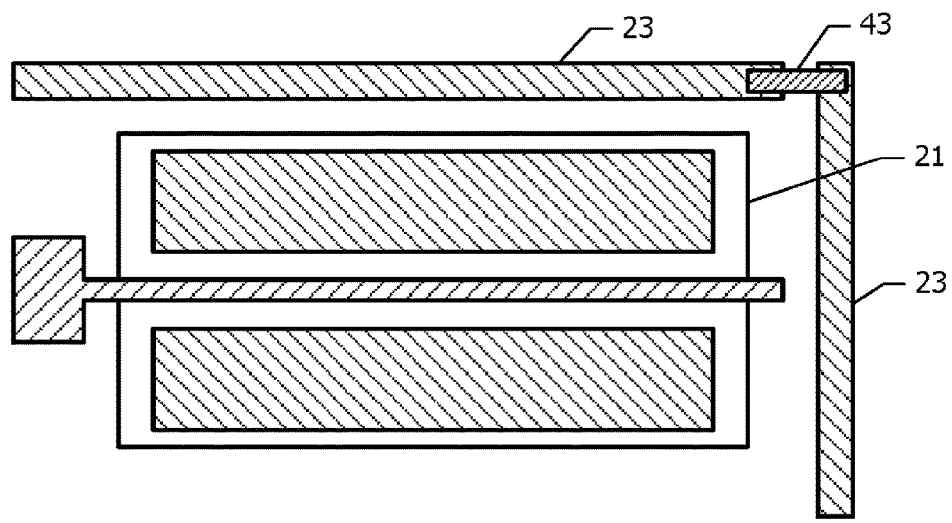
FIG. 8A is a plan view of a semiconductor device according to an eighth embodiment.

FIG. 8A is a plan view of the semiconductor device according to the eighth embodiment. In the eighth embodiment, two guard ring electrodes 23 surround the active region 21 from two orthogonal directions (right and above in FIG. 8A). The two guard ring electrodes 23 are connected to each other by the guard ring connection wiring 43.

Figure 8B:
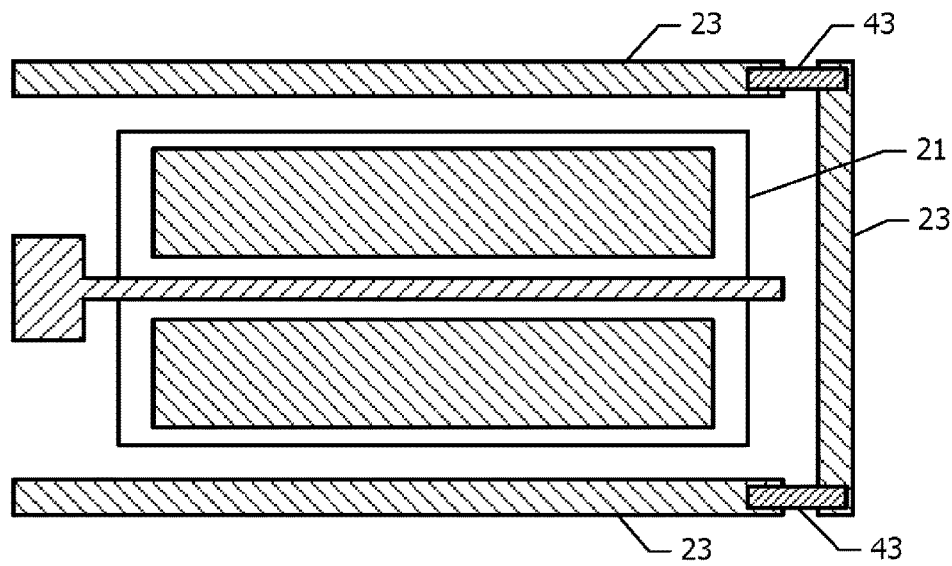
FIG. 8B is a plan view of a semiconductor device according to a modification of the eighth embodiment.

FIG. 8B is a plan view of the semiconductor device according to a modification of the eighth embodiment. In this modification, three guard ring electrodes 23 surround the active region 21 from three directions (right, above, and below in FIG. 8B). The three guard ring electrodes 23 are interconnected by two guard ring connection wirings 43.

As in the eight embodiment (FIG. 8A) and the modification of the eighth embodiment (FIG. 8B), the active region 21 is not always required to be surrounded from four directions, and it may be surrounded from two or three directions. Even those configurations can also suppress the reduction of the drain current Id and reduce the leak current as in the first embodiment.

[Ninth Embodiment]

A semiconductor device according to a ninth embodiment will be described below with reference to FIG. 9. In the following, description of configurations common to those in the semiconductor device (FIGS. 1A, 1B and 1C) according to the first embodiment is omitted.

Figure 9:
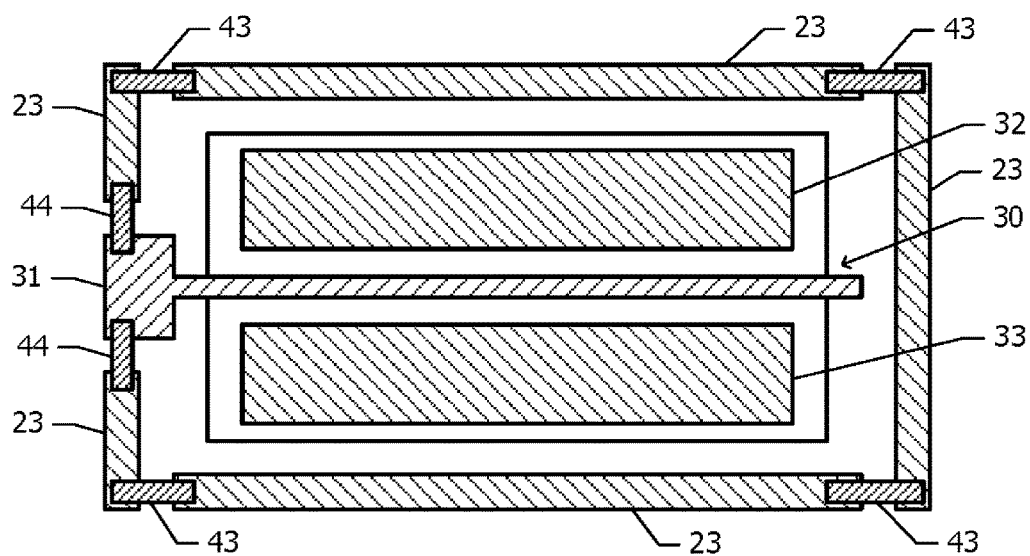
FIG. 9 is a plan view of a semiconductor device according to a ninth embodiment.

FIG. 9 is a plan view of the semiconductor device according to the ninth embodiment. In the ninth embodiment, the gate voltage Vg is applied to the guard ring electrodes 23. The guard ring electrodes 23 are made of the same material as that of the source electrode 32 and the drain electrode 33. At least one of the guard ring electrodes 23 is connected to the gate electrode 31 through the guard ring voltage application wiring 44. The guard ring voltage application wiring 44 is constituted by a wiring that is included in the same wiring layer as including the guard ring connection wirings 43.

In the ninth embodiment, the source voltage Vs being positive relative to the substrate potential Vsub is applied to the source electrode 32 as in the first embodiment and the first comparative example illustrated in FIG. 14B. When the field effect transistor 30 is of the enhancement type, the gate voltage Vg is higher than the source voltage Vs in an ordinary operation state. Accordingly, a voltage higher than the source voltage Vs is applied to the guard ring electrodes 23, whereby the potential of the active region 21 can be raised to the positive side.

Thus, the reduction of the drain current Id attributable to the substrate bias effect can be suppressed as in the first embodiment. Furthermore, as in the first embodiment, it is possible to suppress the leak current that may generate with application of the positive voltage to the guard ring electrodes 23. The configuration of the ninth embodiment is particularly effective when the field effect transistor 30 is of the enhancement type.

A modification of the ninth embodiment will be described below.

When the guard ring electrodes 23 are formed using the same material as that of the gate electrode 31, the gate electrode 31 and one of the guard ring electrodes 23 may be formed as a continuous conductive pattern. In such a configuration, there is no clear boundary between the gate electrode 31 and the one guard ring electrode 23. In this modification, the guard ring voltage application structure for applying the guard ring voltage Vgr to the guard ring electrodes 23 is implemented by forming a pattern of the gate electrode 31 and a pattern of the one guard ring electrode 23 in a continuous state.

[Tenth Embodiment]

A semiconductor device according to a tenth embodiment will be described below with reference to FIG. 10. In the following, description of configurations common to those in the semiconductor device (FIG. 9) according to the ninth embodiment is omitted.

Figure 10:
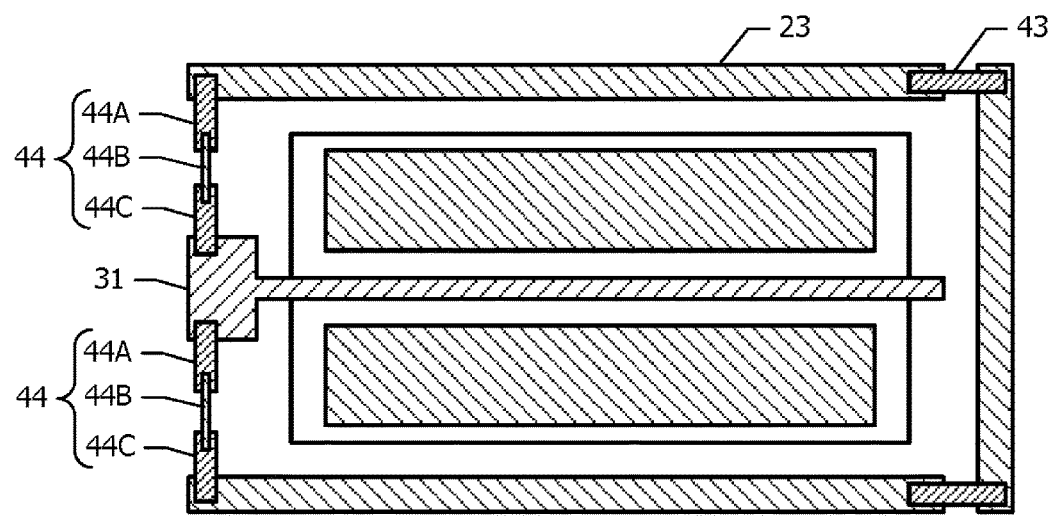
FIG. 10 is a plan view of a semiconductor device according to a tenth embodiment.

FIG. 10 is a plan view of the semiconductor device according to the tenth embodiment. In the ninth embodiment (FIG. 9), the gate electrode 31 and the guard ring electrode 23 are connected to each other by the guard ring voltage application wiring 44 made of the same material as that of the guard ring connection wiring 43 and having low resistance. On the other hand, in the tenth embodiment, the guard ring voltage application wiring 44 has a structure in which relatively low-resistance portions 44A and 44C and a relatively high-resistance portion 44B made of a conductive material having higher resistance than that of the low-resistance portions 44A and 44C are connected in series. The low-resistance portions 44A and 44C are made of, by way of example, the same material as that of the guard ring connection wiring 43. The high-resistance portion 44B is made of a material, for example, zirconium nitride, having higher resistivity than that of the guard ring connection wiring 43.

An advantageous effect of the tenth embodiment will be described below.

In the tenth embodiment, the guard ring voltage application wiring 44 connecting the gate electrode 31 and the guard ring electrode 23 to each other has higher resistance than the guard ring voltage application wiring 44 in the ninth embodiment. Therefore, the leak current flowing from the gate electrode 31 through the guard ring electrode 23 can be reduced.

A modification of the tenth embodiment will be described below. While, in the tenth embodiment, the guard ring voltage application wiring 44 is constituted by the low-resistance portions 44A and 44C and the high-resistance portion 44B, the guard ring voltage application wiring 44 may be constituted by only the high-resistance portion 44B. Furthermore, in the tenth embodiment, the material having higher resistivity than that of the guard ring connection wiring 43 is used for the high-resistance portion 44B. As an alternative, the same material may be used for both the guard ring connection wiring 43 and the guard ring voltage application wiring 44, and the guard ring voltage application wiring 44 may be formed to be thinner than the guard ring connection wiring 43. Such a configuration can also make a resistance value of the guard ring voltage application wiring 44 higher than that of the guard ring connection wiring 43.

[Eleventh Embodiment]

A semiconductor device according to an eleventh embodiment will be described below with reference to FIG. 11. In the following, description of configurations common to those in the semiconductor device (FIG. 9) according to the ninth embodiment is omitted.

Figure 11:
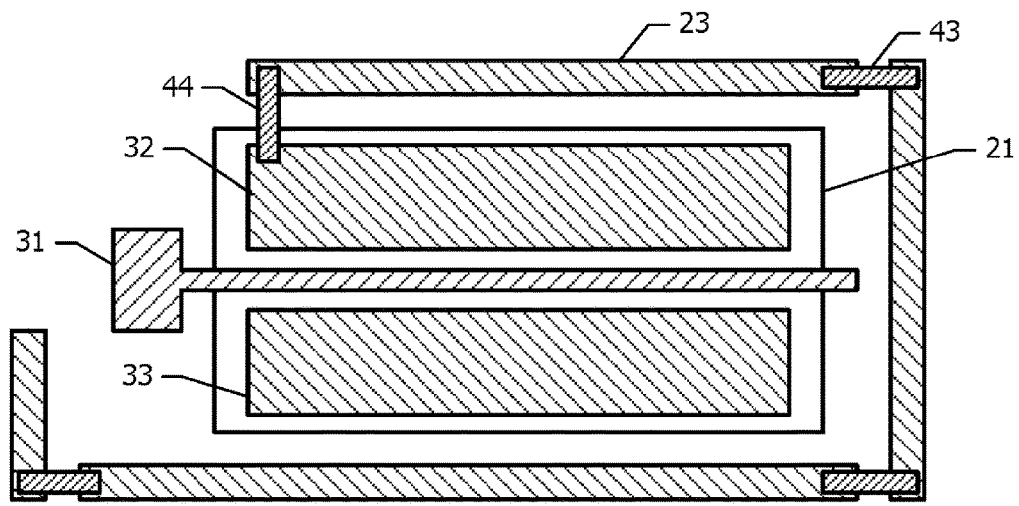
FIG. 11 is a plan view of a semiconductor device according to an eleventh embodiment.

FIG. 11 is a plan view of the semiconductor device according to the eleventh embodiment. In the ninth embodiment, the guard ring electrodes 23 are connected to the gate electrode 31. On the other hand, in the eleventh embodiment, the guard ring electrodes 23 are connected to the source electrode 32 through the guard ring voltage application wiring 44. The guard ring voltage application wiring 44 is included in the same wiring layer as including the guard ring connection wiring 43 and is made of the same material as that of the guard ring connection wiring 43.

When the field effect transistor 30 is of the depression type, the field effect transistor 30 is very often used in a state in which the gate voltage Vg is lower than the source voltage Vs. In such a case, by connecting the guard ring electrodes 23 to the source electrode 32, a higher voltage can be applied to the guard ring electrodes 23 than the case of connecting the guard ring electrodes 23 to the gate electrode 31. As a result, the effect of raising the potential of the active region 21 to the positive side can be enhanced.

A modification of the eleventh embodiment will be described below. The guard ring electrodes 23 may be connected to the source electrode 32 by continuously joining one pattern of the guard ring electrodes 23 to a pattern of the source electrode 32. In this modification, the guard ring voltage application structure for applying the guard ring voltage Vgr to the guard ring electrodes 23 is implemented by forming the one pattern of the guard ring electrodes 23 and the pattern of the source electrode 32 in a continuous state.

While, in the eleventh embodiment, the guard ring electrodes 23 are connected to the source electrode 32, the guard ring electrodes 23 may be connected to the drain electrode 33. In the ordinary operation state, the drain voltage Vd is higher than the source voltage Vs. Thus, a higher voltage can be applied to the guard ring electrodes 23 by connecting the guard ring electrodes 23 to the drain electrode 33. As a result, the effect of raising the potential of the active region 21 to the positive side can be enhanced.

However, when the drain voltage Vd is applied to the guard ring electrodes 23, there is a fear that the leak current between the guard ring electrode 23 and the semiconductor substrate 10 may increase. Whether the guard ring electrodes 23 are to be connected to the source electrode 32 or the drain electrode 33 is desirably determined on the basis of specifications demanded for the semiconductor device.

[Twelfth Embodiment]

A semiconductor device according to a twelfth embodiment will be described below with reference to FIG. 12. In the following, description of configurations common to those in the semiconductor device (FIG. 11) according to the eleventh embodiment is omitted.

Figure 12:
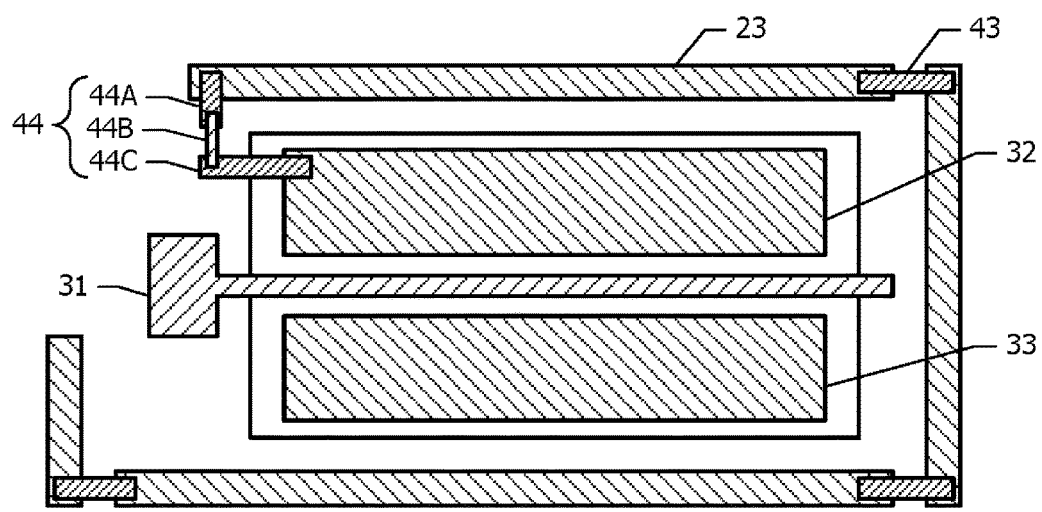
FIG. 12 is a plan view of a semiconductor device according to a twelfth embodiment.

FIG. 12 is a plan view of the semiconductor device according to the twelfth embodiment. In the eleventh embodiment, the guard ring voltage application wiring 44 (FIG. 11) is made of the same low-resistance material as that of the guard ring connection wiring 43. On the other hand, in the twelfth embodiment, as with the guard ring voltage application wiring 44 (FIG. 10) in the tenth embodiment, the guard ring voltage application wiring 44 includes relatively low-resistance portions 44A and 44C and a relatively high-resistance portion 44B made of a conductive material having higher resistance than that of the low-resistance portions 44A and 44C. The low-resistance portions 44A and 44C and the high-resistance portion 44B are connected in series.

An advantageous effect of the twelfth embodiment will be described below.

In the twelfth embodiment, the guard ring voltage application wiring 44 connecting the gate electrode 31 and the guard ring electrode 23 to each other has higher resistance than the guard ring voltage application wiring 44 (FIG. 11) in the eleventh embodiment. Therefore, the effect of reducing the leak current flowing from the source electrode 32 through the guard ring electrode 23 can be enhanced.

A modification of the twelfth embodiment will be described below. While, in the twelfth embodiment, the guard ring voltage application wiring 44 is constituted by the low-resistance portions 44A and 44C and the high-resistance portion 44B, the guard ring voltage application wiring 44 may be constituted by only the high-resistance portion 44B. Furthermore, in the twelfth embodiment, the material having higher resistivity than that of the guard ring connection wiring 43 is used for the high-resistance portion 44B. As an alternative, a resistance value of the guard ring voltage application wiring 44 may be increased by using the same material for both the guard ring connection wiring 43 and the guard ring voltage application wiring 44, and by forming the guard ring voltage application wiring 44 to be thinner than the guard ring connection wiring 43.

[Thirteenth Embodiment]

A semiconductor device according to a thirteenth embodiment will be described below with reference to FIG. 13. In the following, description of configurations common to those in the semiconductor device (FIGS. 1A, 1B and 1C) according to the first embodiment is omitted.

Figure 13:
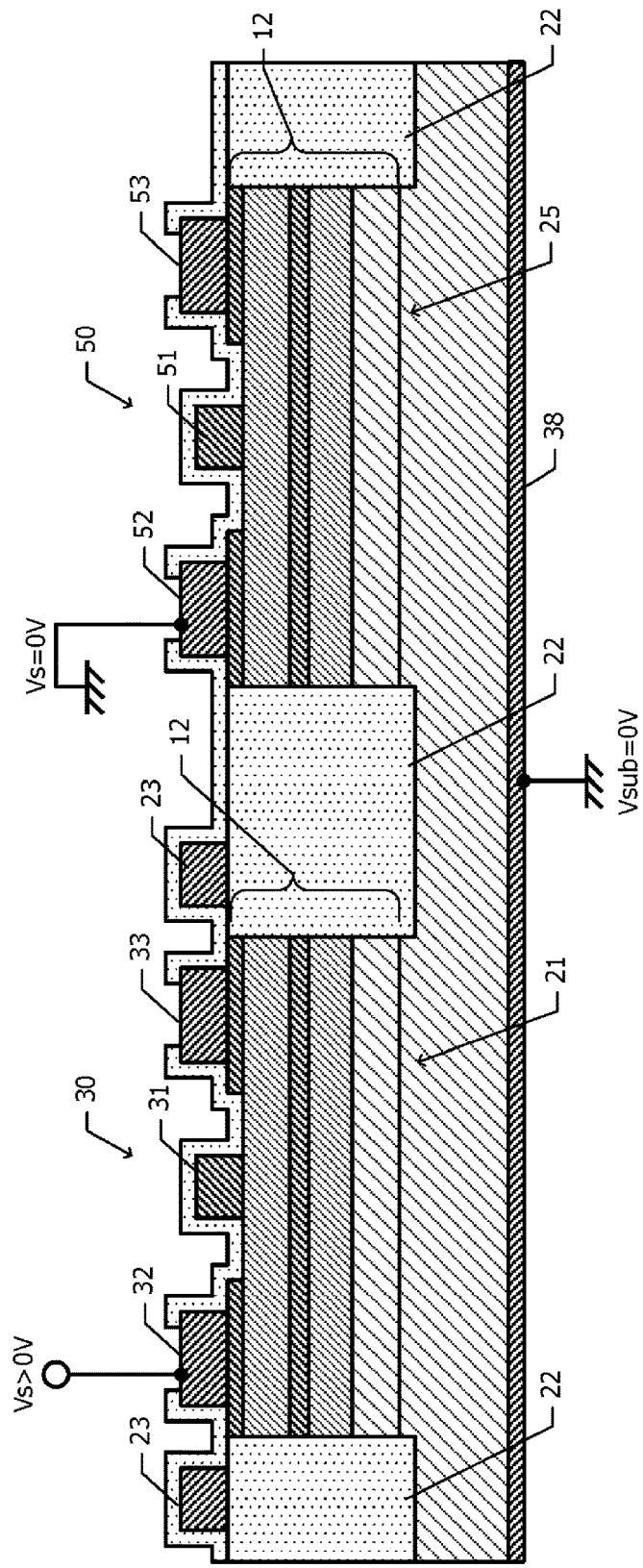
FIG. 13 is a sectional view of a semiconductor device according to a thirteenth embodiment.

FIG. 13 is a sectional view of the semiconductor device according to the thirteenth embodiment. Another active region 25 is arranged adjacent to the active region 21 with the element isolation region 22 interposed therebetween. Field effect transistors 30 and 50 are formed within the active regions 21 and 25, respectively. One of the guard ring electrodes 23 is arranged on the element isolation region 22 in a zone between the active regions 21 and 25 at a position closer to the active region 21. In addition, the other guard ring electrodes 23 are arranged in other zones of the element isolation region 22 around the active region 21 as illustrated in FIG. 1A, for example. The substrate potential Vsub of 0 V is applied to the semiconductor substrate 10 from the substrate electrode 38.

The field effect transistor 30 includes the gate electrode 31, the source electrode 32, and the drain electrode 33, and the source voltage Vs being positive relative to the substrate potential Vsub is applied to the source electrode 32. The adjacent field effect transistor 50 includes a gate electrode 51, a source electrode 52, and a drain electrode 53, and a potential of the source electrode 52 is set equal to the substrate potential Vsub. In other words, the source voltage Vs is 0 V. In the field effect transistor 50, therefore, the reduction of the drain current Id attributable to the substrate bias effect does not occur.

An advantageous effect of the thirteenth embodiment will be described below.

In the thirteenth embodiment, the guard ring electrode 23 arranged on the element isolation region 22 between the active regions 21 and 25 is positioned closer to the active region 21. Accordingly, the effect of raising the potential of the semiconductor layer 12 within the active region 21 to the positive side can be obtained. In the field effect transistor 50 within the other active region 25, since the reduction of the drain current Id attributable to the substrate bias effect does not occur, there is no problem even though the effect of raising the potential of the semiconductor layer 12 within the active region 25 to the positive side is not obtained.

It is needless to say that the above-described embodiments are merely illustrative, and that constituent elements explained in the different embodiments can be partly replaced or combined with each other. Similar advantageous effects obtained with similar features of the embodiments are not repeatedly described for each embodiment. The present disclosure is not limited to the above-described embodiments. It is apparent to those skilled in the art that the above-described embodiments can be, for example, modified, improved, or combined with each other in various ways.

While embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A semiconductor device comprising:
   a semiconductor layer arranged on a semiconductor substrate, the semiconductor layer comprising a first active region and an element isolation region, wherein, when the semiconductor device is viewed in a plan view, the element isolation region surrounds the first active region;
   a first field effect transistor formed in the first active region;
   a plurality of guard ring electrodes separated from each other and configured to affect an electric potential of the first active region through the element isolation region;
   an interlayer insulating film formed over the semiconductor layer, the first field effect transistor, and the guard ring electrodes; and
   at least one guard ring connection wiring formed on the interlayer insulating film and configured to electrically interconnect the plurality of guard ring electrodes.

2. The semiconductor device according to claim 1, wherein the guard ring electrodes are arranged on the element isolation region.

3. The semiconductor device according to claim 1, further comprising second active regions, wherein:
   the guard ring electrodes are arranged on the second active regions, and
   when the semiconductor device is viewed in the plan view, the second active regions are adjacent to the first active region with the element isolation region interposed between the second active regions and the first active region.

4. The semiconductor device according to claim 1, wherein:
   the first field effect transistor comprises a source electrode, a drain electrode, and a gate electrode,
   a positive voltage relative to an electric substrate potential of the semiconductor substrate is applied to the source electrode of the first field effect transistor, and
   the semiconductor device further comprises a guard ring voltage application structure configured to apply, to the guard ring electrodes, a positive voltage relative to the electric substrate potential.

5. The semiconductor device according to claim 4, wherein the guard ring voltage application structure connects at least one of the guard ring electrodes to the gate electrode of the first field effect transistor.

6. The semiconductor device according to claim 5, wherein the guard ring voltage application structure comprises a portion that is made of a conductive material having a higher resistance than the guard ring connection wiring.

7. The semiconductor device according to claim 4, wherein the guard ring voltage application structure connects at least one of the guard ring electrodes to the source electrode or the drain electrode of the first field effect transistor.

8. The semiconductor device according to claim 7, wherein the guard ring voltage application structure comprises a portion that is made of a conductive material having a higher resistance than the guard ring connection wiring.

9. The semiconductor device according to claim 4, wherein the semiconductor layer comprises a third active region that, when the semiconductor device is viewed in the plan view, is arranged adjacent to the first active region, wherein the element isolation region is interposed between the first active region and the third active region,
   a second field effect transistor is formed in the third active region, the second field effect transistor comprising a source electrode to which a potential equal to the electric substrate potential is applied, and
   at least one of the guard ring electrodes comprises a portion arranged on the element isolation region between the first active region and the third active region, and arranged closer to the first active region than the third active region.

10. The semiconductor device according to claim 1, wherein the guard ring electrodes surround the first active region from at least two orthogonal directions.

11. The semiconductor device according to claim 1, wherein the at least one guard ring connection wiring is configured to electrically interconnect two guard ring electrodes among the plurality of guard ring electrodes.

12. The semiconductor device according to claim 1, wherein the at least one guard ring connection wiring is configured to electrically interconnect respective ends of the two guard ring electrodes.

* * * * *